(12) United States Patent
Kim et al.

(10) Patent No.: US 7,682,886 B2
(45) Date of Patent: Mar. 23, 2010

(54) FLAT PANEL DISPLAY AND MANUFACTURING METHOD OF FLAT PANEL DISPLAY

(75) Inventors: Bo-sung Kim, Seoul (KR); Joon-hak Oh, Gyeonggi-do (KR); Yong-uk Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/325,951

(22) Filed: Dec. 1, 2008

(65) Prior Publication Data

US 2009/0111211 A1    Apr. 30, 2009

Related U.S. Application Data

(62) Division of application No. 11/497,690, filed on Aug. 1, 2006.

(30) Foreign Application Priority Data

Aug. 1, 2005    (KR) ............... 2005-0070111

(51) Int. Cl.
*H01L 21/84* (2006.01)
(52) U.S. Cl. ............... 438/161; 438/99; 438/642; 438/652; 438/678; 257/40; 257/59; 257/72; 257/E51.022
(58) Field of Classification Search ............... 438/161, 438/99, 642, 652, 678; 257/40, E51.022, 257/59, 72
See application file for complete search history.

(56) References Cited

U.S. PATENT DOCUMENTS

| | | | |
|---|---|---|---|
| 6,569,707 B2 | 5/2003 | Dimitrakopoulos et al. | |
| 6,614,500 B2 | 9/2003 | Kim | |
| 2002/0045289 A1* | 4/2002 | Dimitrakopoulos et al. | ... 438/99 |
| 2004/0023447 A1 | 2/2004 | Hirakata et al. | |
| 2004/0108569 A1* | 6/2004 | Breen et al. | ............ 257/500 |
| 2004/0127614 A1 | 7/2004 | Jiang et al. | |
| 2005/0045885 A1 | 3/2005 | Kim et al. | |
| 2005/0139823 A1 | 6/2005 | Hirakata et al. | |
| 2006/0001020 A1 | 1/2006 | Zhang et al. | |

FOREIGN PATENT DOCUMENTS

| | | |
|---|---|---|
| CN | 1511863 A | 7/2004 |
| CN | 1577912 A | 2/2005 |
| JP | 2000-269504 A | 9/2000 |
| JP | 2003-248240 A | 9/2003 |

(Continued)

*Primary Examiner*—Tu-Tu V Ho
(74) *Attorney, Agent, or Firm*—Innovation Counsel LLP

(57) ABSTRACT

The present disclosure relates to a display device comprising an insulating substrate; a source electrode and a drain electrode on the insulating substrate and separated by a channel area; an organic semiconductor layer formed in the channel area and on at least a portion of the source electrode and at least a portion of the drain electrode; and a self-assembly monolayer having a first portion disposed between the organic semiconductor layer and the source electrode and a second portion disposed between the organic semiconductor layer and the drain electrode to reduce contact resistance between the electrodes and the organic semiconductor layer. Thus, embodiments of present invention provide a display device including a TFT that is enhanced in its performance.

4 Claims, 11 Drawing Sheets

FOREIGN PATENT DOCUMENTS

| | | |
|---|---|---|
| JP | 2004-080026 A | 3/2004 |
| JP | 2004-186393 A | 7/2004 |
| JP | 2004-346082 A | 12/2004 |
| JP | 2005-093542 A | 12/2004 |
| JP | 2005-150640 A | 6/2005 |

\* cited by examiner 141  120  130  143

FLAT PANEL DISPLAY AND MANUFACTURING METHOD OF FLAT PANEL DISPLAY

RELATED APPLICATIONS

This patent application is a Divisional Patent Application of U.S. application Ser. No. 11/497,690, filed Aug. 1, 2006, which application claims priority to and the benefit of Korean Patent Application No. 2005-0070111, filed on Aug. 1, 2005 in the Korean Intellectual Property Office, the contents of which are hereby incorporated by reference herein in their entirety.

BACKGROUND

1. Field of the Invention

The present disclosure relates to a display device and a manufacturing method of a display device. More particularly, the present disclosure relates to a display device and a manufacturing method of a display device including an organic thin film transistor (O-TFT), where an organic semiconductor layer is provided.

2. Description of the Related Art

Thin film transistors (TFTs) are used as switch elements to control operation of display pixels, and as driver elements to drive the display pixels. TFTs are incorporated in a number of display types, such as liquid crystal displays (LCDs), organic light emitting diode (OLED) displays, inorganic light emitting diode displays, flat panel displays, electro phoretic indication displays or the like. TFTs include a gate electrode, a gate insulating layer formed on the gate electrode, a semiconductor layer formed on the gate insulating layer, and a source electrode and a drain electrode which are separated from each other across the semiconductor layer to define a channel area.

Recently, as interest in flexible display devices has emerged, flat panel display designs using a plastic substrate have been studied. However, since flat panel displays using silicon as a semiconductor layer are manufactured at 300° C. or more, plastic substrates generally cannot be used. Therefore, an organic thin film transistor (O-TFT) using organic semiconductor material as the semiconductor layer instead of silicon is employed to manufacture flexible display devices.

Conventionally, the source electrode and the drain electrode are formed of metal such as gold (Au), palladium (Pd), platinum (Pt), or the like. These materials have a high work function, so that electric charges flow smoothly. However, source and drain structures using these metals are difficult to form by sputtering, and it is difficult to etch delicate patterns thereon. Thus, these materials are generally not compatible with the source electrode and drain electrode fabrication processes for O-TFTs.

On the other hand, conductive metal oxides, such as indium tin oxide (ITO) or indium zinc oxide (IZO), have the following advantages: their work function is high, ITO and IZO structures are easily formed using a sputtering method, and it is easy to form delicate patterns on ITO or IZO. Therefore, materials such as IZO and/or ITO are generally used for the source electrodes and the drain electrodes of O-TFTs instead of the aforementioned metal materials. However, ITO and IZO generate contact resistance at the contact interface with the organic semiconductor layer, thereby decreasing the drain current on-off ratio property of the TFT.

SUMMARY

The present invention provides a display device including a TFT that is enhanced in its performance.

Another aspect of the present invention is to provide a manufacturing method of a display device including a TFT that is enhanced in its performance.

According to an embodiment of the invention, a display device comprises an insulating substrate; a source electrode and a drain electrode separated by a channel area; an organic semiconductor layer formed in the channel area and on at least a portion of the drain electrode and at least a portion of the source electrode; and a self-assembly monolayer having a first portion disposed between the organic semiconductor layer and the source electrode and a second portion between the organic semiconductor layer and the drain electrode to reduce contact resistance between the electrodes and the organic semiconductor layer.

According to an embodiment of the invention, the self-assembly monolayer covers the source electrode and the drain electrode.

According to an embodiment of the invention, the source electrode and the drain electrode comprise transparent conductive metal oxide.

According to an embodiment of the invention, the source electrode and the drain electrode comprise one of ITO or IZO.

According to an embodiment of the invention, the self-assembly monolayer chemically combines with the source electrode and the drain electrode.

According to an embodiment of the invention, the display device further comprises a bank encompassing the organic semiconductor layer and exposing the channel area.

According to an embodiment of the invention, the self-assembly monolayer comprises at least one of halogen substituted aryldihalophosphate, halogen substituted arylhalophosphate, halogen substituted arylsulfonylhalide, halogen substituted benzonylhalide, halogen substituted arylhalide, halogen substituted aryltrihalosilane, halogen substituted alkyltrihalosilane and derivatives thereof.

According to an embodiment of the invention, the self-assembly monolayer comprises at least one of halogen substituted naphtyldihalophosphate, halogen substituted naphtylhalophosphate, halogen substituted naphtylsulfonylhalide, halogen substituted naphtylhalide, halogen substituted naphtyltrihalosilane, and derivatives thereof.

According to an embodiment of the invention, the insulating substrate is a plastic substrate.

According to an embodiment of the invention, the organic semiconductor layer comprises at least one of pentacene, 3, 4, 9, 10-perylene tetracarboxylic dianhydride (PTCDA), oligothiopene, polythiophene, and polythienylenevinylene.

According to an embodiment of the invention, the display device comprises at least one of a liquid crystal display device, an organic light emitting diode device, a flat panel display device, and an electrophoretic indication display device.

According to an embodiment of the invention, there is provided a manufacturing method of a display device comprising providing an insulating substrate; forming a source electrode and a drain electrode on the insulating substrate, wherein the source electrode and the drain electrode are separated by a channel region; introducing a self-assembly monolayer material to a region proximate the source electrode and the drain electrode; forming a self-assembly monolayer having a first portion on at least a portion of the source electrode and a second portion on at least a portion of the drain electrode; and forming an organic semiconductor layer adjacent at least a portion of the self-assembly monolayer and in the channel region.

According to an embodiment of the invention, the manufacturing method further comprises forming a gate electrode on the insulating substrate and a gate insulating layer on the gate electrode before forming the source electrode and the drain electrode, wherein the forming the organic semiconductor layer comprises forming a region of organic semiconductor material on the gate insulating layer, the source electrode, and the gate electrode, and patterning the region of organic semiconductor material using photolithography.

According to an embodiment of the invention, the manufacturing method further comprises forming a bank encompassing the channel and exposing at least a portion of the source electrode and a portion of the drain electrode after forming the source electrode and the drain electrode.

According to an embodiment of the invention, the organic semiconductor layer is formed in the bank by an ink-jet method.

Additional features of the invention will be set forth in the description which follows, and in part will be apparent from the description, or may be learned by practice of the invention.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention through exemplary embodiments.

DETAILED DESCRIPTION

Figure 1:
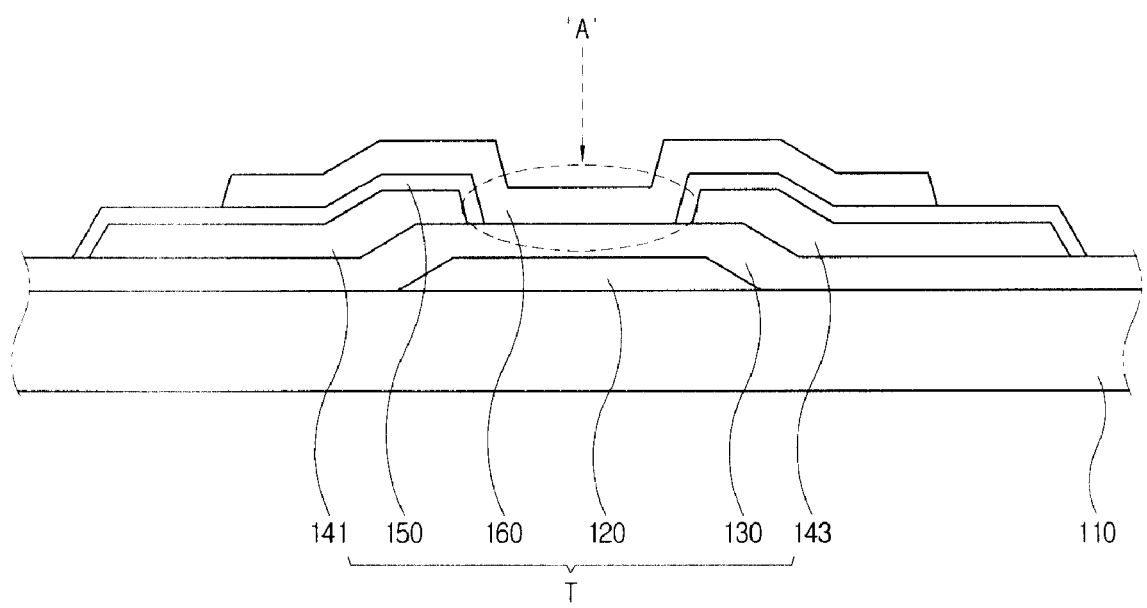
FIG. 1 is a sectional view of a display device according to a first embodiment of the invention.

Reference will now be made in detail to the embodiments of the present invention, examples of which are illustrated in the accompanying drawings, wherein like reference numerals refer to like elements throughout. The embodiments are described below with reference to the figures.

It will be understood that when an element such as a layer, film, region, or substrate is referred to as being "on" another element, it can be directly on the other element or intervening elements may also be present.

FIG. 1 is a sectional view of a flat panel display according to a first embodiment of the invention. More specifically, FIG. 1 is a sectional view of a substrate where a TFT "T" is provided.

A flat panel display according to the invention, where an organic TFT T is provided, includes an insulating substrate 110, a gate electrode 120 formed on the insulating substrate 110, a gate insulating layer 130 covering the gate electrode 120, a source electrode 141 and a drain electrode 143 on the gate insulating layer 130 to define a channel area A. The source electrode 141 and drain electrode 143 are separated from each other across the gate electrode 120. TFT T also includes a self-assembly monolayer 150 formed on the source electrode 141 and the drain electrode 143, and an organic semiconductor layer 160 disposed on the self-assembly monolayer 150 and in the channel area A.

The insulating substrate 110 comprises an insulating material such as glass, quartz, ceramic, or plastic. When the TFT T is used for a flexible flat panel display, substrate 110 is preferably made of plastic. The plastic substrate includes, for example, one of polyethylene terephthalate (PET), polyethylenapthanate (PEN), polycarbonate (PC), polyimide (PI), and polynorborneen (PNB).

The gate electrode 120 is formed on the insulating substrate 110. The gate electrode 120 is a conductive metal layer comprising at least one of gold (Au), platinum (Pt), palladium (Pd), aluminum (Al), chrome (Cr), Aluminum/Copper (Al/Cu), and molybdenum tungsten (MoW), for example.

The gate insulating layer 130 is formed on the gate electrode 120. The gate insulating layer 130 comprises insulating material such as silicon nitride (SiNx) or silicon oxide (SiOx), which is deposited on an entire surface of the insulating substrate 110 while covering the gate electrode 120. The gate insulating layer 130 has a structure that does not react chemically when treated with self-assembly monolayer material, and preferably does not include a hydroxy group on the surface thereof.

The source electrode 141 and the drain electrode 143 are positioned on the gate insulating layer 130 and are separated from each other across the gate electrode 120. The channel area A is a region over the gate electrode 120 between the source electrode 141 and the drain electrode 143.

Conventionally, the source electrode 141 and the drain electrode 143 are formed of metal such as Au, Pd, Pt, or the like. These materials have a high work function, so that electric charges flow smoothly. However, as noted above, these metals are generally not compatible with processes for forming the source electrode 141 and the drain electrode 143 of an O-TFT. Layers of these metals are difficult to form by sputtering (they are typically formed by an evaporation method), and it is hard to form delicate patterns thereon by etching.

Therefore, the source electrode 141 and the drain electrode 143 are formed using a transparent conductive metallic oxide which has high work function, can be formed easily by a sputtering method, and can easily be delicately patterned. The transparent conductive metallic oxide may be either ITO or IZO.

The organic semiconductor layer 160 is formed on the source electrode 141 and the drain electrode 143. However, when ITO or IZO contacts the organic semiconductor material of layer 160, a high potential barrier arises due to different properties between ITO or IZO and the organic semiconductor layer 160 (the difference between the work function of ITO or IZO and an electric affinity of the organic semiconductor 160). The high potential barrier impedes electron flow so that electric current does not flow smoothly, thereby decreasing the drive current on-off ratio property of the O-TFT.

Accordingly, the self-assembly monolayer 150 is formed between the source and drain electrodes 141, 143 and the organic semiconductor layer 160, in order to reduce the potential barrier. The self-assembly monolayer 150 reduces the potential barrier, reducing contact resistance between the organic semiconductor layer 160 and the source electrode 141 and drain electrode 143.

According to embodiments, the self-assembly monolayer 150 is formed on the source electrode 141 and the drain electrode 143 and is not formed on the gate insulating layer 130. That is, surface treatment to form self-assembly monolayer 150 is selectively performed only on the source electrode 141 and the drain electrode 143, not on the channel area A of the gate insulating layer 130.

Thus, the selective surface treatment of the source electrode 141 and drain electrode 143 arises from properties of the self-assembly monolayer 150. The molecules of the self-assembly monolayer material spontaneously adhere to a surface of solid (the source electrode 141 and the drain electrode 143), by chemically combination with the molecules of the source electrode 141 and drain electrode 143. Accordingly, the self-assembly monolayer 150 is a stably thin monolayer and becomes highly regular reacting to a specific molecule. As a result, the organic semiconductor layer 160 formed on self-assembly monolayer 150 has a larger grain size and lower contact resistance.

As mentioned above, the self-assembly monolayer 150 forms a regular chemical combination with the source electrode 141 and the drain electrode 143. As a result, space charge is generated between the source electrode 141 and the drain electrode 143 and the organic semiconductor layer 160. The space charge lowers the potential barrier and reduces the contact resistance between the source electrode 141 and the drain electrode 143 and the organic semiconductor layer 160. Therefore, the current ratio property of the O-TFT is enhanced.

Here, the self-assembly monolayer material comprises at least one of following: halogen substituted aryldihalophosphate in structural formula 1; halogen substituted arylhalophosphate in structural formula 2; halogen substituted arylsulfonylhalide in structural formula 3; halogen substituted benzonylhalide in structural formula 4; halogen substituted arylhalide in structural formula 5; and halogen substituted aryltrihalosilane or alkyltrihalosilane in structural formula 6.

Here, X is a halogen, such as chlorine (Cl), bromine (Br), Fluorine (F), and iodine (I), wherein a halogen situated in aryl or alkyl may be situated in any of the ortho, meta, and para positions. R in structural formula 6 is the aryl or the alkyl.

The aryl in structural formulas 1 through 6 may be phenyl, chlror phenayl, and fluoro phenyl, or naphtyl in structural formula 7.

Further, derivatives of an aromatic compound in structural formulas 1 through 7 may be used for the self-assembly monolayer.

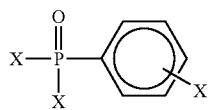

<structural formula 1>

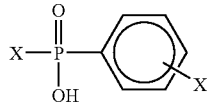

<structural formula 2>

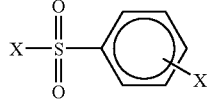

<structural formula 3>

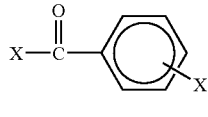

<structural formula 4>

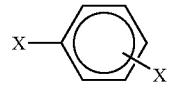

<structural formula 5>

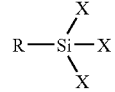

<structural formula 6>

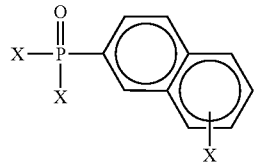

<structural formula 7>

The organic semiconductor layer 160 is formed on the self-assembly monolayer 150. In order to prevent damage to organic semiconductor layer 160, the organic semiconductor layer 160 is formed on the channel area A after the gate electrode 120, the source electrode 141, and the drain electrode 143 are formed. This fabrication process is used because the organic material used for organic semiconductor layer 160 has low chemical resistance and plasma resistance. That is, if the gate electrode 120, the source electrode 141, and the drain electrode 143 are formed after the organic semiconductor layer 160 is formed, the organic material of organic semiconductor layer 160 is attacked by chemical material, plasma, or the like which are used for forming the gate electrode 120, the source electrode 141, and the drain electrode 143. The resulting semiconductor layer 160 does not function properly.

However, in a process architecture (PA) in which gate electrode 120 is disposed on the organic semiconductor layer 160 differently from the process architecture illustrated in FIGS. 4A to 4F, the self-assembly monolayer 150 may also be interposed between the electrodes 141, 143 and the organic semiconductor layer 160 so as to reduce the contact resistance between the electrodes 141, 143 and the organic semiconductor layer 160.

The organic semiconductor layer 160 uses pentacene that has 5 connected benzene rings, 3,4,9,10-perylene tetracarboxylic dianhydride (PTCDA), oligothiopene, polythiophene, polythienylenevinylene, or the like. In some embodiments, conventional organic semiconductor materials may be used.

Using the above principles, an improved O-TFT may be manufactured and incorporated in a flat panel display. The O-TFT may be incorporated in a number of display types, such as LCDs, OLEDs, inorganic light emitting diodes, or the like. The displays may be manufactured according to conventional methods.

Hereinafter, the function and efficiency of the O-TFT according to embodiments of the invention will be described, referring to FIGS. 2a through 3.

Figure 2A:
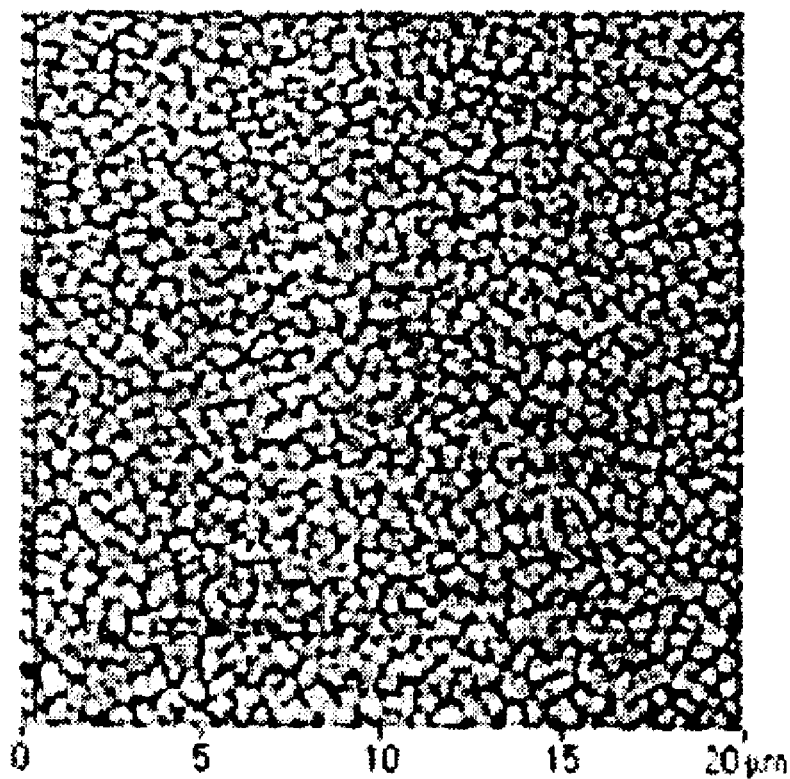
FIG. 2a is a drawing showing a surface of an organic semiconductor layer when a self-assembly monolayer is not formed according to the first embodiment.
Figure 2B:
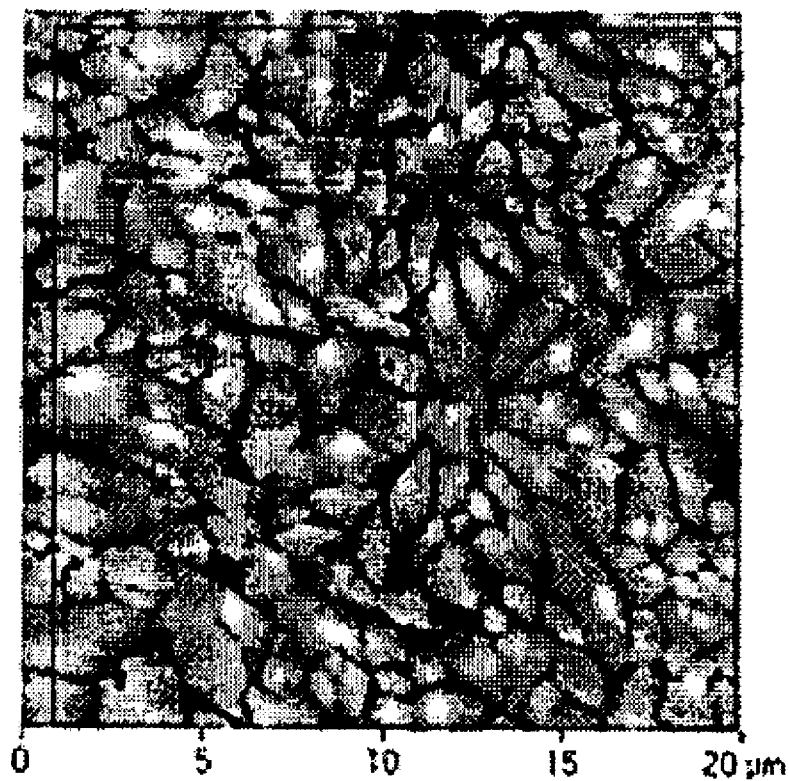
FIG. 2b is a drawing showing the surface of the organic semiconductor layer when a self-assembly monolayer is formed according to the first embodiment.

FIG. 2a is a picture of a surface of the organic semiconductor layer taken using an atomic force microscope (AFM) when the self-assembly monolayer is not formed, while FIG. 2b is a picture of the surface of the organic semiconductor layer when the self-assembly monolayer is formed.

Referring to FIG. 2a, the grain size of the organic semiconductor layer 160 is small when the self-assembly monolayer 150 is not formed. By contrast, the grain size of the organic semiconductor layer 160 is large when self-assembly monolayer 150 is provided, as shown in FIG. 2b. The larger grain size illustrates the improved growth and stability of the organic semiconductor material on the source electrode 141 and the drain electrode 143 where the self-assembly monolayer 150 is formed. That is, it says that the organic semiconductor material grows well on the source electrode 141 and the drain electrode 143 where the self-assembly monolayer 150 is formed, so that transfer rate of electric charges becomes enhanced.

Figure 3:
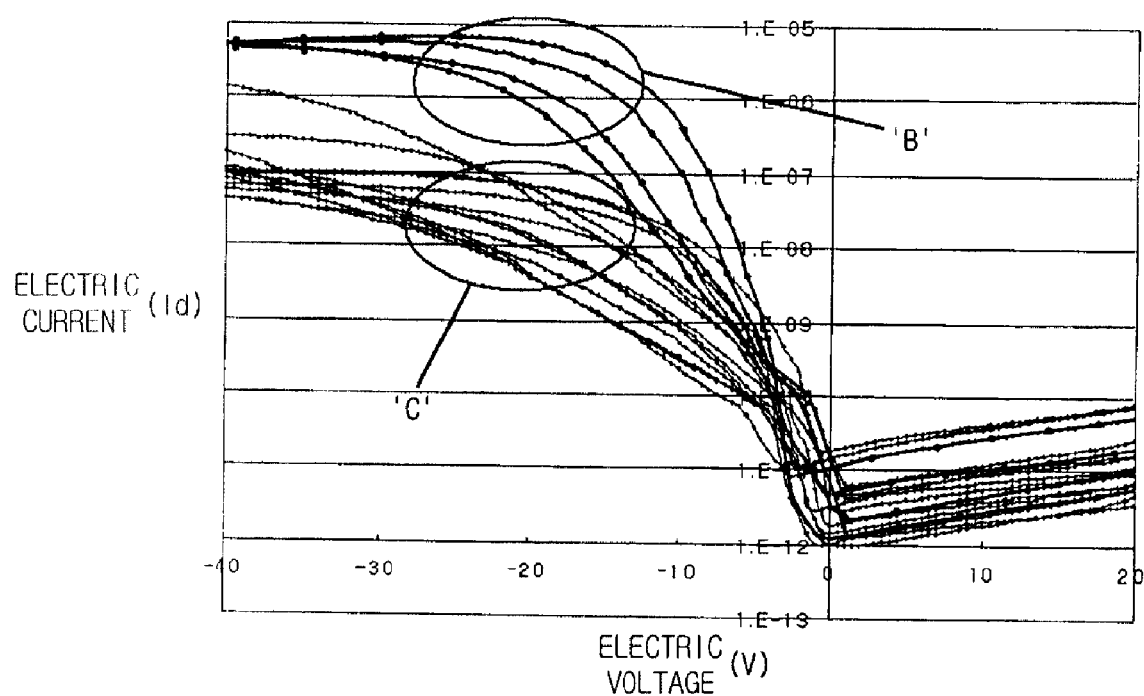
FIG. 3 is a graph according to the first embodiment of the invention.

FIG. 3 is a graph showing electric current value for the drain of the O-TFT versus electric voltage value applied to the gate of the O-TFT for the case where the self-assembly monolayer 150 is formed, and the case where the self-assembly monolayer 15 is not formed.

Referring to FIG. 3, 'B' is electric current value versus electric voltage value when the self-assembly monolayer 150 is formed, and 'C' is electric current value versus electric voltage value when the self-assembly monolayer 150 is not formed. FIG. 3 illustrates the effect that the electric current value is bigger with the self-assembly monolayer 150 than without the self-assembly monolayer 150 for a particular value of applied electric voltage. Thus, it shows the contact resistance is reduced, when the self-assembly monolayer 150 is formed, to increase the electric current value.

Generally, on-off current ratio property of the TFT will be expressed as following.

$$\frac{I_{on}}{I_{off}} = \left(\frac{\mu}{\sigma}\right)\left(\frac{C_o^2}{qN_A t^2}\right)V_D^2$$

Here, $I_{on}$ is the maximum electric current value; $I_{off}$ is an off-state leakage current; $\mu$ is the transfer rate of electric charges; $\square$ is conductivity of a thin film; q is quantity of electric charge; $N_A$ is density of electric charge; t is the thickness of the semiconductor layer; $C_O$ is an oxide film capacitance; and $V_D$ is drain voltage. The expression shows that the electric current ratio $I_{on}/I_{off}$ is proportional to $\mu$, the transfer rate of electric charge.

FIG. 3 shows the electric current ratio $I_{on}/I_{off}$ is larger with the self-assembly monolayer 150 than without it. FIG. 3 illustrates the principle that the transfer rate of electric charges of the O-TFT increases when the self-assembly monolayer 150 is formed, thereby enhancing the performance of the TFT.

Next, a manufacturing method of a flat panel display including the O-TFT will be illustrated, referring to FIGS. 4a through 4e.

Figure 4A:
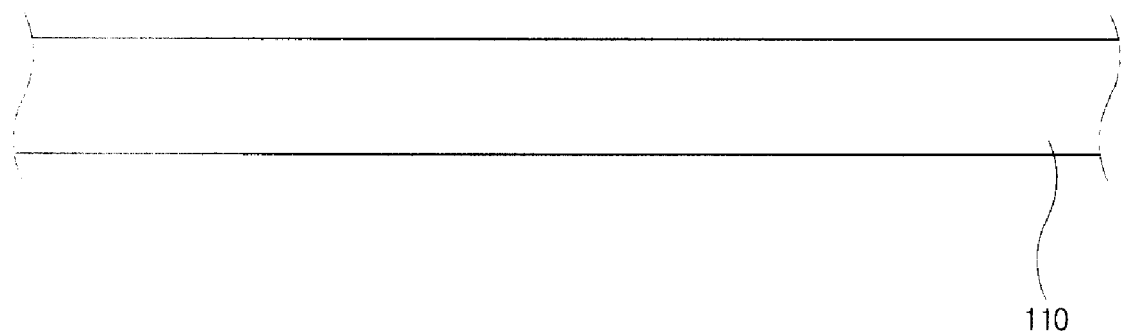
FIGS. 4a through 4f are sectional views illustrating a manufacturing method of a display device according to the first embodiment of the invention.

Referring to FIG. 4a, the insulating substrate 110 is provided. In some embodiments, substrate 110 includes glass, quartz, ceramic, or plastic. When the TFT T according to embodiments of the invention is used for the flexible flat panel display, it is preferably made of plastic.

Figure 4B:
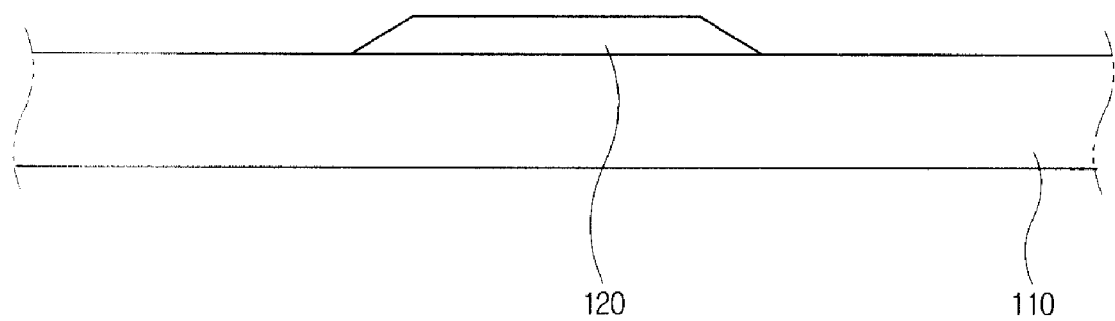

Referring to FIG. 4b, gate electrode 120 is formed on the insulating substrate 110 by first depositing a gate electrode material (e.g., including at least one of Au, Pt, Pd, Al, Cr, Al/Cu, and MoW by sputtering or chemical vapor deposition (CVD)), and then removing unnecessary gate electrode material by photolithography and etch processes. Gate electrode 120 is thus formed on substrate 110 with the desired pattern.

Figure 4C:
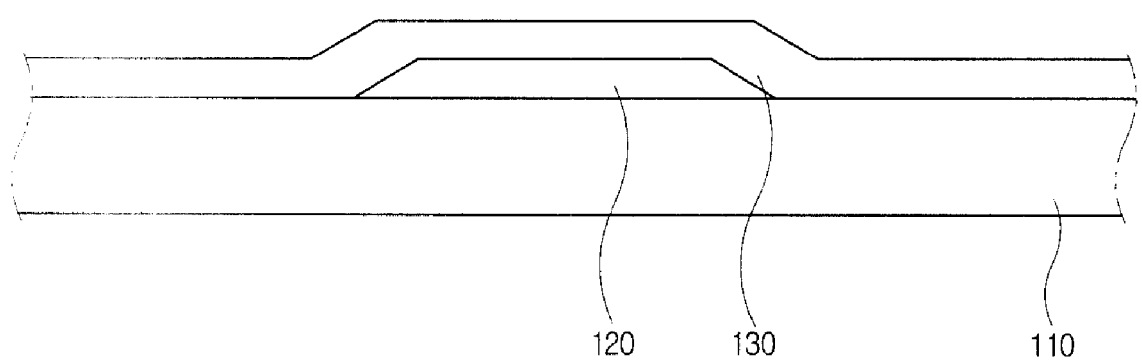

Referring to FIG. 4c, the gate insulating layer 130 is formed. The gate insulating layer 130 is made of a material that is substantially non-reactive with the selected self-assembly monolayer material. For example, gate insulating material 130 may comprise silicon nitride (SiNx) or silicon oxide (SiOx) which does not include a hydroxy group on the surface thereof, and has a structure not chemically reacting when the self-assembly monolayer material is added.

Figure 4D:
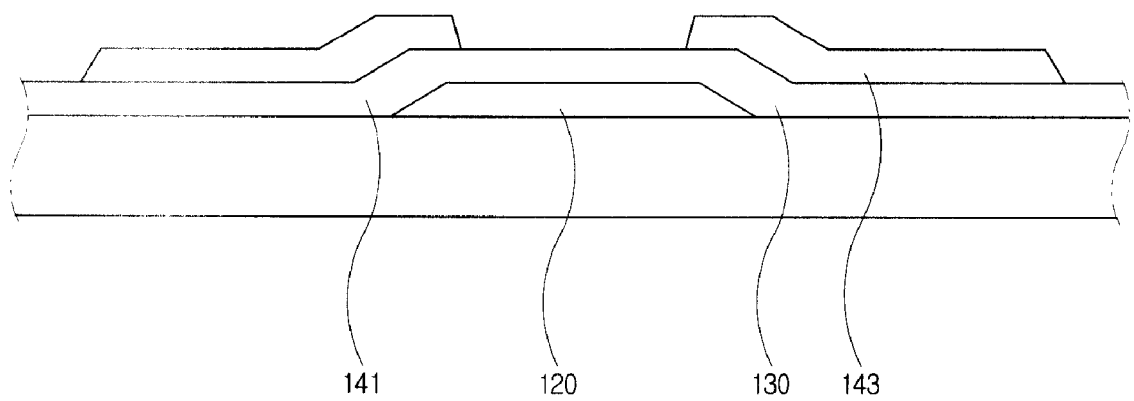

Referring to FIG. 4d, a transparent conductive metal oxide, such as ITO or IZO, is applied to the gate insulating layer 130 by sputtering or evaporation. The material then is removed where unnecessary using photolithography and the etching processes, to form the source electrode 141 and the drain electrode 143. Source electrode 141 and drain electrode 143 are separated from each other across the gate electrode 120. The channel area A is defined as a region between the source electrode 141 and the drain electrode 143 over the gate electrode 120.

Figure 4E:
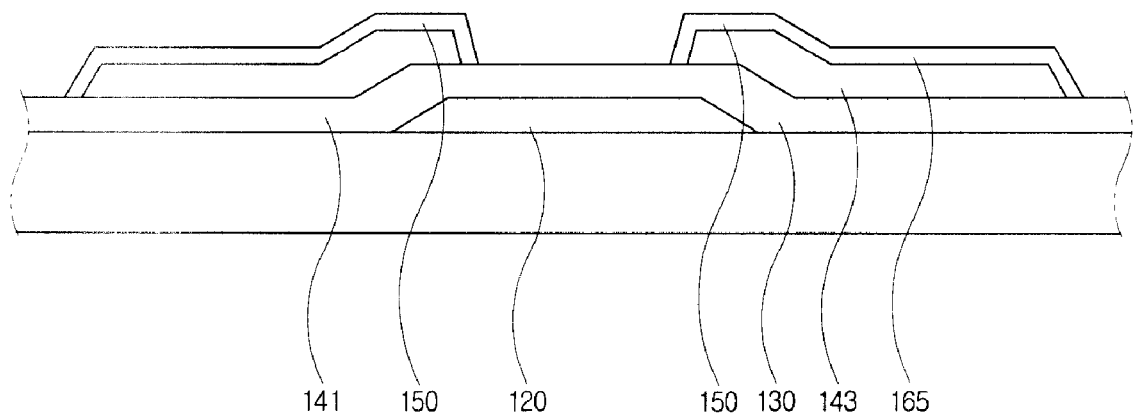

Referring to FIG. 4e, the self-assembly monolayer material is applied on the source electrode 141 and the drain electrode 143. Molecules of the self-assembly monolayer material spontaneously adhere to a specific solid (here, a material of the source electrode and the drain electrode), and chemically combine to form the self-assembly monolayer 150.

That is, when the self-assembly monolayer 150 is treated, a surface treatment is selectively performed only onto the source electrode 141 and the drain electrode 143, not on the channel area A of the gate insulating layer 130. After the self-assembly monolayer 150 is formed, the self-assembly monolayer material remaining on the gate insulating layer 130 is removed by selective cleaning. In embodiments in which source electrode 141 and drain electrode 143 comprise a transparent conductive material such as ITO and/or IZO, the self-assembly monolayer material includes an aromatic compound and/or derivatives thereof.

Figure 4F:
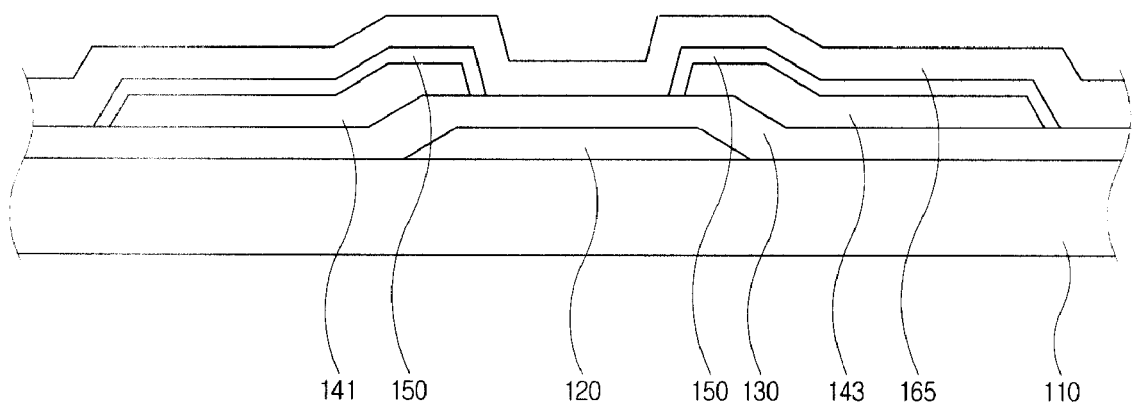

Referring to FIG. 4f, organic semiconductor material, such as pentacene, 3,4,9,10-perylene tetracarboxylic dianhydride (PTCDA), oligothiopene, polythiophene, polythienylenevinylene, or the like, is formed on the self-assembly monolayer 150 by evaporation. The organic semiconductor layer 160 is formed by the photolithography process to remain in the channel area A and at least a portion of the source electrode 141 and the drain electrode 143, thereby completing the O-TFT structure shown in FIG. 1.

Thereafter, a flat panel display comprising the O-TFT, such as an LCD, an OLED, an inorganic light emitting diode, or the like, is manufactured. For example, the flat panel display may be manufactured using conventional or other methods.

Thus, the self-assembly monolayer 150 forms a regular chemical combination with the material of the source electrode 141 and the drain electrode 143 if made of an appropriate material (e.g., an aromatic compound such as those disclosed above). Self-assembly monolayer 150 thereby generates space charge between the electrodes 141, 143 and the organic semiconductor layer 160 to lower the potential barrier and reduce the contact resistance between the organic semiconductor layer 160 and the electrodes 141, 143. Therefore, the on-off current ratio property of the O-TFT is enhanced.

Hereinafter, a flat panel display including an O-TFT according to a second embodiment of the invention will be described, referring to FIG. 5. In the second embodiment, different features of the flat panel display from one in the first embodiment are mentioned. In the second embodiment, an organic semiconductor layer 260 is formed by an ink-jet method (rather than the evaporation and photolithography techniques disclosed above for the first embodiment).

Figure 5:
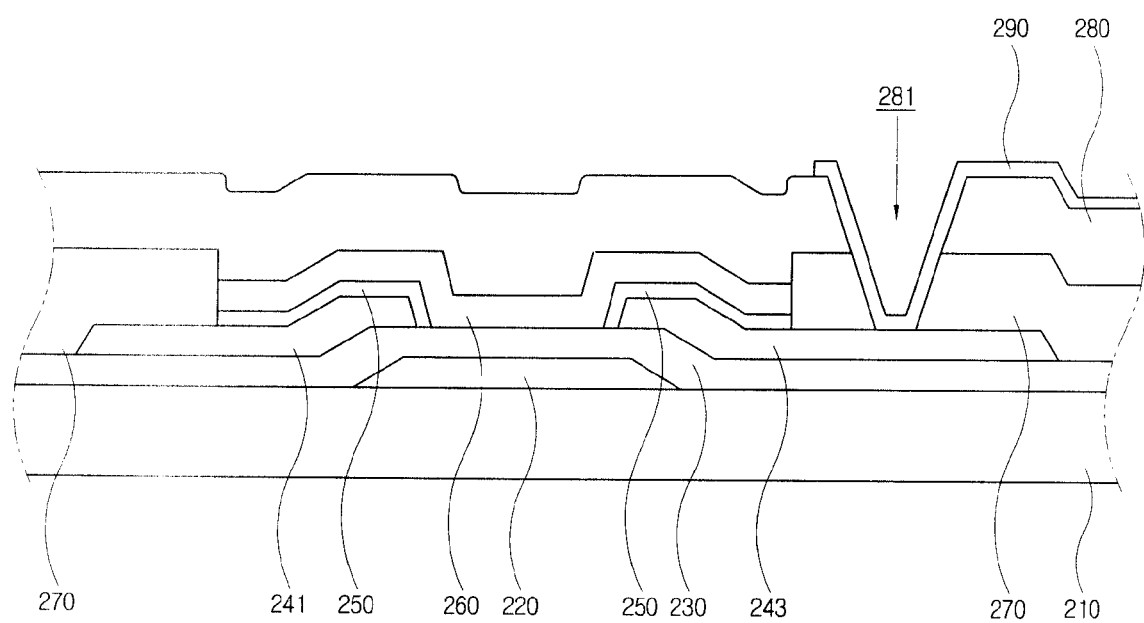
FIG. 5 is a sectional view of a display device according to a second embodiment of the invention.

Referring to FIG. 5, after forming the source electrode 241 and the drain electrode 243, a bank 270 is formed around a circumference including at least a portion of the source electrode 241 and the drain electrode 243. The bank 270 encompasses a channel area A and exposes at least portions of the source electrode 241 and the drain electrode 243 on which a self assembly monolayer is to be formed. The bank 270 is shaped and configured so that the organic semiconductor layer 260 may be formed in the channel area A by the ink-jet method. A contact hole 281 is formed on the bank 270 to expose the drain electrode 243.

Then, the aforementioned self-assembly monolayer material is applied to an inside of the bank 270 to form a self-assembly monolayer 250. The self-assembly monolayer 250 is formed only on the source electrode 241 and the drain electrode 243 due to the physical/chemical characteristics of the self-assembly monolayer material. Thereafter, organic semiconductor material dissolved in solvent is jetted into the bank 270. The organic semiconductor layer 260 is formed when the solvent is volatilized.

An organic passivation layer 280 is formed by a conventional or other method, and the contact hole 281 is formed. Contact hole 281 exposes the drain electrode 243, and then a pixel electrode 290, electrically connected to the drain electrode 243 through the contact hole 281, is formed on the organic passivation layer 280.

In the second embodiment, the organic semiconductor layer is formed by a simpler method than in the first embodiment. Further, contact resistance between the organic semiconductor layer 260 and the electrodes 241, 243 is reduced to enhance the on-off current ratio property of the O-TFT.

The invention is not limited to the embodiments described and shown but a plurality of modifications and combinations of details from the different embodiments are possible within the scope of the claims. The invention can be implemented in a wide variety of display types; for example, in at least one of an organic light emitting diode, a flat panel display, and an electrophoretic indication display.

It will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. A manufacturing method of a display device comprising:
providing an insulating substrate;
forming a source electrode and a drain electrode on the insulating substrate, wherein the source electrode and the drain electrode are separated by a channel region;
forming a bank surrounding the channel region and exposing at least a portion of the source electrode and at least a portion of the drain electrode;
introducing a self-assembly monolayer material to a region proximate the source electrode and the drain electrode that are exposed by the bank;
forming a self-assembly monolayer having a first portion on at least a portion of the source electrode and a second portion on at least a portion of the drain electrode; and
forming a semiconductor layer adjacent at least a portion of the self-assembly monolayer and in the channel region, wherein the self-assembly monolayer is surrounded by the bank.

2. The manufacturing method of claim 1, further comprising forming a gate electrode on the insulating substrate and a gate insulating layer on the gate electrode before forming the source electrode and the drain electrode.

3. The manufacturing method of claim 1, wherein the semiconductor layer is formed in the bank by an ink-jet method.

4. The manufacturing method of claim 1, wherein the display device comprises at least one of a liquid crystal display device, an organic light emitting diode device, a flat panel display device, and an electrophoretic indication display device.

* * * * *